United States Patent

Ripper et al.

[11] Patent Number: 6,129,609
[45] Date of Patent: Oct. 10, 2000

[54] METHOD FOR ACHIEVING A WEAR PERFORMANCE WHICH IS AS LINEAR AS POSSIBLE AND TOOL HAVING A WEAR PERFORMANCE WHICH IS AS LINEAR AS POSSIBLE

[75] Inventors: Bert Ripper, Postbauer-Heng; Robert Hofmann, Truchtlaching; Peter Lehfeld; Holger Lundt, both of Burghausen, all of Germany

[73] Assignee: Wacker Siltronic Gesellschaft für Halbleitermaterialien AG, Burghausen, Germany

[21] Appl. No.: 09/185,328

[22] Filed: Nov. 3, 1998

[30] Foreign Application Priority Data

Dec. 18, 1997 [DE] Germany ............... 197 56 537

[51] Int. Cl.⁷ ....................................... B24B 49/00
[52] U.S. Cl. ......................... 451/8; 451/21; 451/550
[58] Field of Search ............................ 451/8, 21, 41, 451/261, 269, 270, 271, 526, 527, 530, 550

[56] References Cited

U.S. PATENT DOCUMENTS

| | | |
|---|---|---|
| 1,486,341 | 3/1924 | Hofze . |
| 4,739,589 | 4/1988 | Brehm et al. . |
| 5,016,399 | 5/1991 | Vinson .................... 51/118 |
| 5,121,572 | 6/1992 | Hilscher ................ 51/111 R |
| 5,177,908 | 1/1993 | Tuttle ................... 51/283 R |
| 5,297,364 | 3/1994 | Tuttle . |
| 5,394,655 | 3/1995 | Allen et al. ................. 451/63 |
| 5,609,517 | 3/1997 | Lafaro ....................... 451/529 |
| 5,609,718 | 3/1997 | Meiorle . |
| 5,618,447 | 4/1997 | Sandho . |
| 5,643,405 | 7/1997 | Bello et al. . |
| 5,921,855 | 7/1999 | Osterheld et al. .......... 451/527 |
| 5,941,759 | 8/1999 | Kitajima et al. ............ 451/41 |
| 5,944,583 | 8/1999 | Cruz et al. ................ 451/41 |

FOREIGN PATENT DOCUMENTS

| | | |
|---|---|---|
| 3742953 | 6/1989 | Germany . |
| 90/14926 | 12/1990 | WIPO . |

OTHER PUBLICATIONS

Patent Abstracts of Japan, vol. 096,007, Jul. 31, 1996 & JP08061949A (SpeedfamCo. Ltd.), Mar. 8, 1996.

Primary Examiner—Timothy V. Eley
Assistant Examiner—Dung Van Nguyen
Attorney, Agent, or Firm—Collard & Roe, P.C.

[57] ABSTRACT

Material removing machining is for wafer shaped workpieces, in particular semiconductor wafers. There is a method for achieving a wear performance which is as linear as possible for a tool which has an essentially planar working surface for the material removing machining of wafer shaped workpieces. The tool has a wear performance which is as linear as possible. There are also a method and a device for measuring a wear profile on an essentially planar working surface for the material removing machining of wafer shaped workpieces. There is also a carrier which is used for the two-sided material removing machining of wafer shaped workpieces.

5 Claims, 8 Drawing Sheets

METHOD FOR ACHIEVING A WEAR PERFORMANCE WHICH IS AS LINEAR AS POSSIBLE AND TOOL HAVING A WEAR PERFORMANCE WHICH IS AS LINEAR AS POSSIBLE

BACKGROUND OF THE INVENTION

1. Field of the Invention

The present invention relates to the material removing machining of wafer shaped workpieces, in particular semiconductor wafers. The present invention also relates to a method for achieving a wear performance which is as linear as possible for a tool which has an essentially planar working surface for the material removing machining of wafer shaped workpieces, and relates to a tool having a wear performance which is as linear as possible. The present invention also relates to a method and a device for measuring a wear profile on an essentially planar working surface for the material removing machining of wafer shaped workpieces. Finally, the present invention also relates to a carrier which is used for the two-sided material removing machining of wafer shaped workpieces.

2. The Prior Art

Prior art known carriers are described in U.S. Pat. No. 4,739,589.

Wafer shaped workpieces can be subjected to a material removing machining in various ways. As a rule, the machining has one or more of the following objectives. For example, removing damage close to the surface is an objective, plus an increase in planarity and parallelism of the wafer sides is another objective as well as smoothing the wafer sides. The machine tools are usually grinding, lapping and polishing tools. A common feature of the tools is an essentially planar working surface which can be used to machine one side of the workpiece. During the machining of the workpiece, the workpiece and the working surface of the machine tool execute a relative movement. With regard to the number of workpieces which are machined simultaneously, it is possible to distinguish between single wafer machining and batch machining. It is also possible to make a distinction with regard to the number of sides of the wafers machined, the distinction being between single side machining and double side machining. The present invention can in principle be applied to all the abovementioned machining processes.

Wear to the working surface of the machine tool is practically always associated with the material removing machining of a workpiece. Over the course of time, this wear means that it is no longer possible to machine the workpiece uniformly, so that the shape of the machined workpieces becomes incorrect. For this reason, the working surface of the tool has to be corrected at regular intervals, for example by regrinding or by leveling using trimming rings. However, frequent interruptions to work caused by correction intervals impair the productivity of the machining process considerably.

SUMMARY OF THE INVENTION

Therefore, it is an object of the present invention to provide a method by which it is possible to avoid correcting the working surface of a tool or at least to make the time intervals between two correction phases considerably longer.

The invention relates to a method for achieving a wear performance which is as linear as possible in the case of a tool which has an essentially planar working surface for the material removing machining of wafer shaped workpieces, comprising (a) determining a wear profile of the working surface;

(b) replacing the working surface by a modified working surface which is divided into surface elements, a surface element having a specific wear resistance and adopting a specific position on the modified working surface, and each surface element being arranged on the modified working surface in such a way that there is a relationship between the wear profile determined, on the one hand, and the wear resistance and the position of the surface element, on the other hand.

The invention also relates to a tool which can be prepared by employing the method. In the tool, the working surface is divided into surface elements, with each surface element having a specific wear resistance and adopting a specific position on the working surface. There is a correlation between a wear profile determined, on the one hand, and the wear resistance and the position of the surface element, on the other hand.

The invention in particular makes it possible to ensure that the inevitable wear to the working surface of the tool is as uniform as possible. Also according to the invention, the working surface which comes into contact with the workpiece, for example the surface of a lapping wheel or of a polishing cloth which comes into contact with the workpiece, maintains its essentially planar form. This linear wear performance of the working surface results in the fact that the wear is more homogenous over the entire working surface of the tool. Thus the inevitable wear to the working surface will no longer have an adverse effect on the shape of the workpieces machined or on the productivity of the machining process.

The advantageous wear performance of the working surface is achieved by the fact that the working surface of the tool is modified and is adapted to the wear situation which is actually present. To do this, it is first necessary to determine the wear profile of the working surface. This is achieved either by measuring the wear profile of a used working surface or by computer-simulating the wear profile taking into account the kinematic conditions which prevail during the machining process. The results of measurements of wear profiles can also be used to optimize the models on which the simulation calculations are based.

The wear profile determined for a working surface of the tool is a representation of the working surface whose shape has been changed as a result of wear. Here only wear-related changes to the shape of the working surface are taken into account. Deformation to the working surface which has different causes, for example production related curvature of the working surface, is not included in the representation. There are working surfaces which are subject to rotationally symmetrical loads, for example the grinding wheels of grinding tools, the lapping wheels of lapping tools and the polishing cloths of polishing tools. In these cases, even a radial wear profile which is determined along one radius of the working surface gives accurate information about wear-related changes to the shape of the working surface.

According to the invention, reference is made to the information contained in the wear profile concerning the local differences in the wear to the working surface, followed by preparing a modified working surface. The modified working surface is created in such a way that at locations which are exposed to a relatively high load the resistance of the material of the working surface to abrasion is high. On the other hand, at locations which are exposed to a less considerable load the resistance of the material of the working surface to abrasion is lower, resulting in the wear performance of the modified working surface becoming more uniform. The resistance can be increased by hardening the material used or by replacing it with harder material. The resistance can be reduced by replacing the material used with softer material or by reducing the basic surface area of the surface element which is subjected to load during the machining of workpieces.

According to the invention, the modified working surface is divided into surface elements which are characterized by specific properties. Each surface element adopts a specific position on the modified working surface and, in plan view, has a specific geometric shape. In principle, the shape is not subject to any particular restrictions. However, it is preferable for the surface elements to have a shape which is selected from a group which comprises rings, ring segments, polygons with preferably 3 to 10 sides, circles and circle segments. The number of surface elements ranges between 3 and 10,000. Adjacent surface elements do not necessarily have to abut one another, but rather may be separated from one another by a gap of a specific width. If the gap width is zero, adjacent surface elements abut one another. The hardness of the material from which a surface element is produced imparts a specific resistance to abrasion to this element, which resistance is referred to below as wear resistance. Consequently, the wear resistance of a surface element is reduced when it consists of a softer material than a surface element which has the same shape and same basic surface area but is made from harder material. The wear resistance of the surface element is also reduced if its basic surface area is reduced by the existence of gaps, holes or other measures which reduce the surface area. In this case, the surface element is subjected to greater loads when machining workpieces than a similar surface element which has a larger basic surface area.

Two surface elements are considered to be of the same type if they correspond to one another in terms of wear resistance. There is a correlation between the wear profile determined, on the one hand, and the wear resistance and the position of a surface element on the modified working surface, on the other hand. The surface elements are positioned on the modified working surface in accordance with the expected position-dependent wear. On the modified working surface, surface elements of equal wear resistance are situated at locations on the working surface which are subjected to comparable loads. A surface element of increased wear resistance is situated at locations which according to the wear profile determined are subjected to higher loads. If the wear profile determined indicates that one should expect a lower level of loading at a certain location, a surface element of reduced wear resistance will be situated at this location. Overall, the modified working surface is made in such a way that the wear to the surface elements is as uniform as possible despite loads which differ in certain locations.

In order to measure a wear profile, the present invention provides a method which is easy to carry out, comprising
 (a) measuring the distances between a planar reference surface and the working surface without contact at a plurality of measurement points;
 (b) converting the distances measured into wear depths which describe the actual wear to the working surface at the measurement points; and
 (c) producing a wear profile of the working surface on the basis of the wear depths.

The greater the density of the measuring points, the better the wear profile corresponds to the actual shape of the tool working surface which is subjected to load. An exact representation of the wear profile is obtained if the working surface of the tool is moved across the workpiece steadily while the workpiece remains at rest. In this case, the surface of the workpiece is converted to the mirror image of the wear profile.

The invention also relates to a device for measuring a wear profile, which device has a measurement body with supporting surfaces for placing the measurement body on the working surface. There is at least one sensor which is accommodated in the measurement body and which measures the distance between a reference surface and the working surface without contact at a measuring point of the reference surface.

In the case of double side batch machining, the objective of making the wear performance of the working surface linear can be achieved by means of a carrier of particular construction.

Therefore, the invention also relates to a carrier for holding workpieces between essentially planar working surfaces of a tool for machining wafer shaped workpieces. This tool is a disk which is provided with circular openings for accommodating the workpieces, wherein the centers of the openings are arranged on circular paths. If appropriate, in the region of the center of the carrier, the centers of adjacent openings are positioned on a circular path lying on different circular paths.

When these carriers are used, the wear performance of the working surfaces is more even than when prior art carriers are used.

BRIEF DESCRIPTION OF THE DRAWINGS

Other objects and features of the present invention will become apparent from the following detailed description considered in connection with the accompanying drawings, which disclose several embodiments of the present invention. It should be understood, however, that the drawings are designed for the purpose of illustration only and not as a definition of the limits of the invention.

Where the explanations relate to devices for machining wafer shaped workpieces, they are preferred embodiments in which devices which can be used for lapping semiconductor wafers are shown so as to represent all the application areas of the invention.

In the drawing, wherein similar reference characters denote similar elements throughout the several views.

DETAILED DESCRIPTION OF PREFERRED EMBODIMENTS

Figure 1:
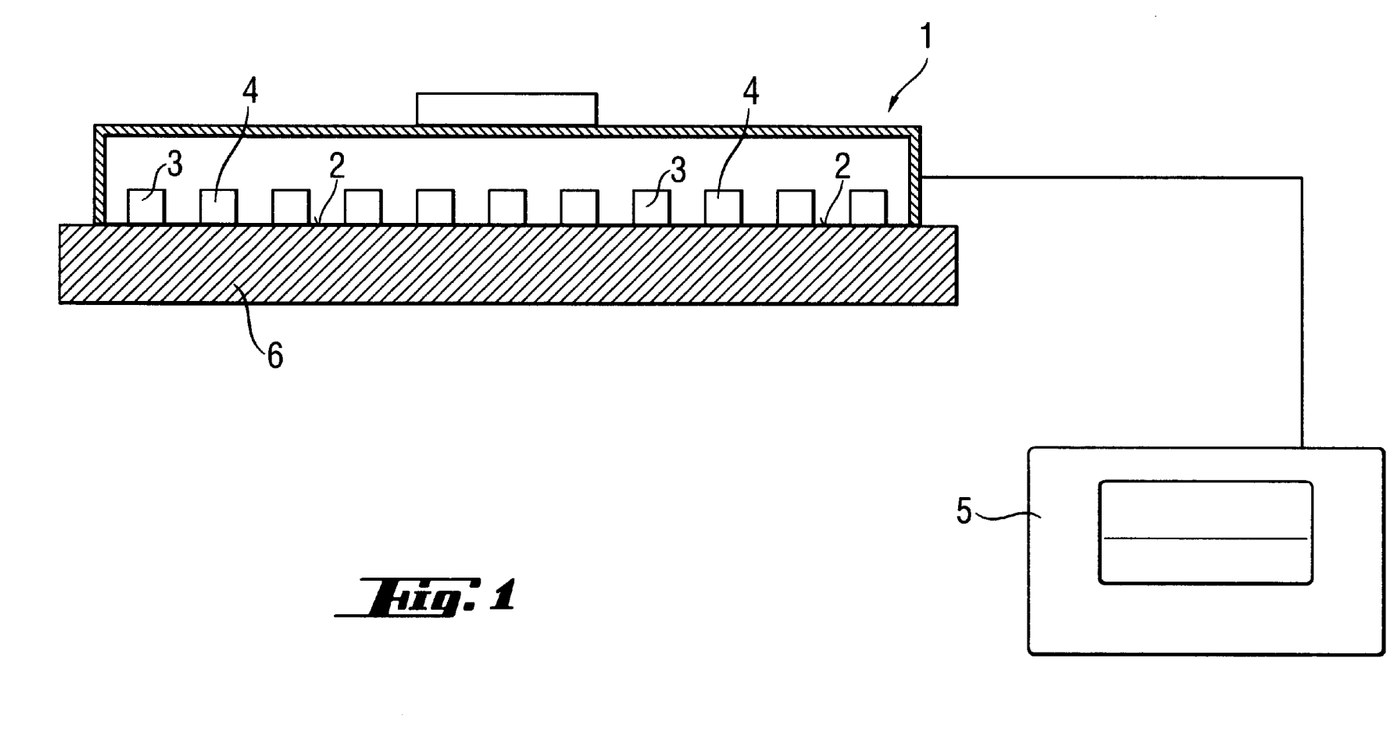
FIG. 1 shows a device which is suitable for measuring a wear profile.

Turning now in detail to the drawings, FIG. 1 shows a device suitable for measuring a wear profile. The device comprises a. measurement body 1 with support surfaces 2 for positioning the measurement body on a working surface. The support surfaces 2 lie in a single plane. At least one electronic sensor 3, which can be used to measure the distance between a reference plane 4 and the working surface without contact, is positioned and contained in the measurement body. It is preferable to use sensors which measure the distances using a capacitive measurement principle. The reference plane is congruent with the plane in which the support surfaces lie or it lies parallel to this plane. In the embodiment illustrated, a plurality of sensors are arranged fixedly next to one another, at regular intervals. If the number of sensors is increased, the measurement accuracy can be improved. However, a high measurement accuracy can also be achieved with only one sensor if this sensor can be displaced parallel to the reference surface. The measurement body shown in FIG. 2 may, for example, be designed not as a ruler (as shown), but rather as a carriage (not shown) along which a sensor is guided in order to measure a wear profile. The device is preferably connected to a computer 5, with the aid of which the measurement result is evaluated and displayed. Before a measurement is carried out, the device may be placed against a comparison standard 6 and. calibrated.

Figure 2:
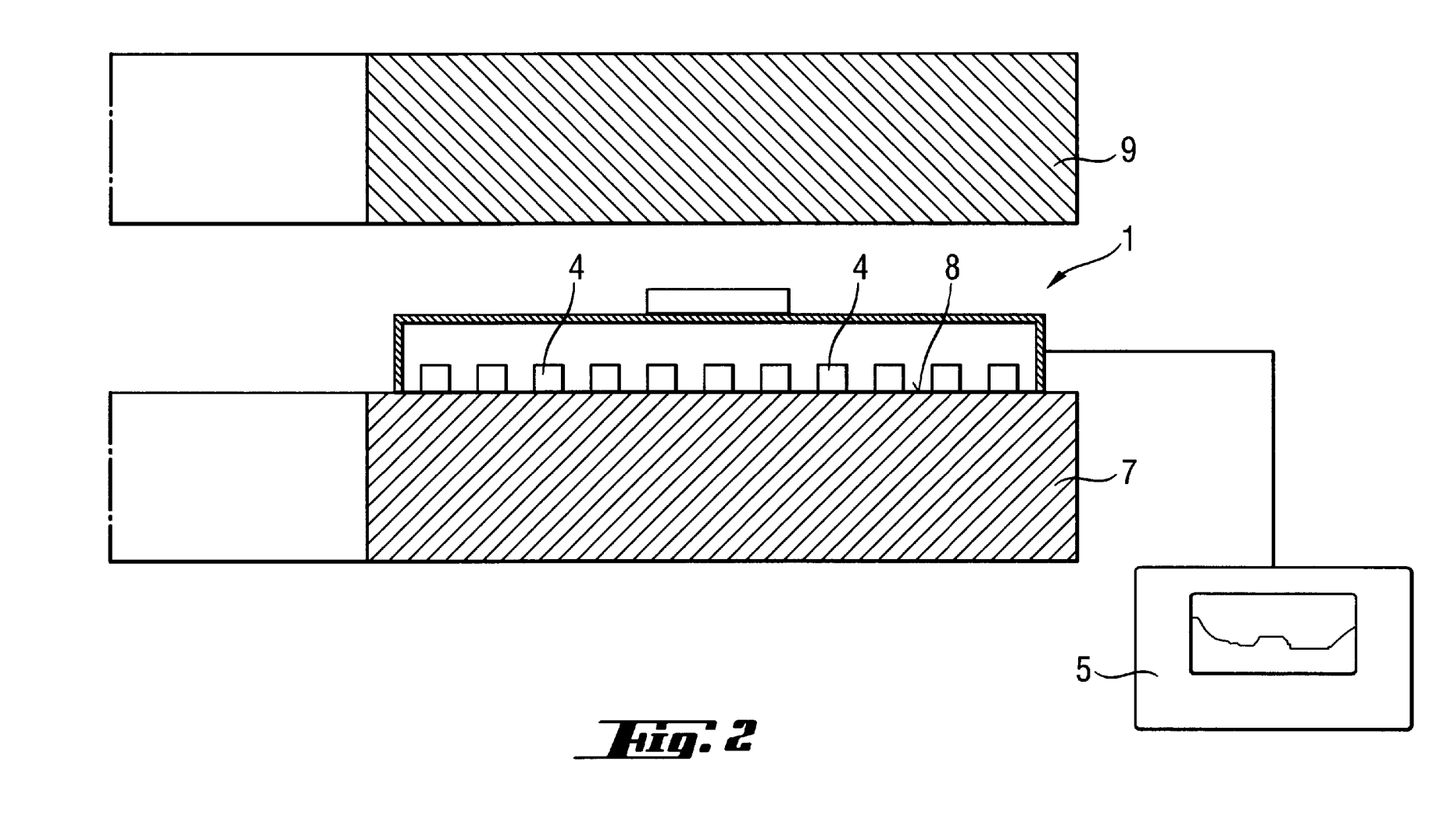
FIG. 2 diagrammatically illustrates how a wear profile is measured using a device in accordance with FIG. 1.

FIG. 2 diagrammatically illustrates the measurement of a wear profile on the basis of the example of the lapping wheels of a lapping machine. The measurement body 1 is placed against the surface of a lower lapping wheel 7. The distances between the reference surface 4 and the surface 8 of the lower lapping wheel are measured along the radius of the lower lapping wheel at a plurality of measurement points of the reference surface and are stored. During a subsequent: measurement on the upper lapping wheel 9, the distances between the reference surface and the surface of the upper lapping wheel are also measured along the radius of the upper lapping wheel at the same measurement points of the reference surface and are stored. In order to find the wear profile of the lower (upper) lapping wheel, first of all the distance which was measured at one measurement point between this measurement point and the surface of the upper (lower) lapping wheel is subtracted from the distance which was measured between this measurement point and the surface of the lower (upper) lapping wheel. The difference is referred to as the wear depth and describes the actual wear to the lapping wheel in question at the associated measurement point. In geometrical terms, the wear depth can be understood as a vector which is perpendicular to the reference surface and the length of which indicates the wear to the working surface. Therefore, the wear profile of a working surface is preferably produced by joining the vector ends together by interpolation, so that a smooth curve or surface is achieved.

The wear profile of a working surface which is used in a machine for the single side machining of workpieces is measured as described above. However, in this case the wear depth which is to be assigned to one measurement point is obtained from the difference between two distances measured between the reference surface and the working surface at this measurement point. One distance is measured before there has been any wear to the working surface, and the other distance is measured after wear to the working surface has taken place.

Figure 3:
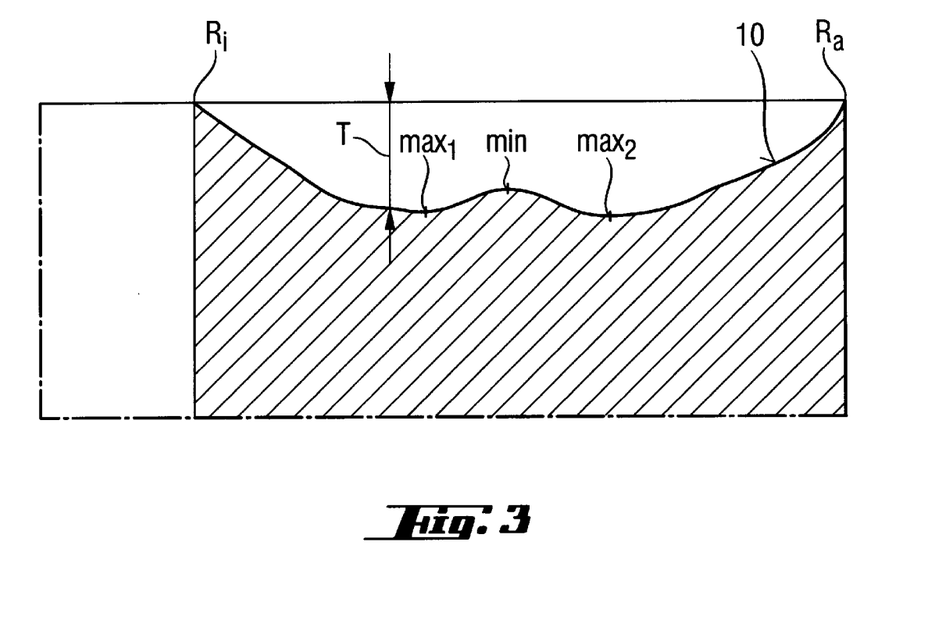
FIG. 3 shows a partial cross-sectional view of a typical radial wear profile of a lapping disk.

FIG. 3 shows a typical radial wear profile of a lapping wheel in partial cross-section. The surface 10 of the lapping wheel is not planar, but rather is of uneven structure as a result of different levels of abrasion. The wear depths T are not constant between the inner edge $R_i$ of the lapping wheel and the outer edge $R_a$ of the lapping wheel. Between the inner edge $R_i$ and a local maximum $max_1$, they increase steadily, then they pass through a local minimum min between the local maximum $max_1$ and another local maximum $max_2$, and they decrease again steadily between the local maximum $max_2$ and the outer edge $R_a$. The wear profile reveals uneven loading on the lapping wheel, the reaction to which, according to the invention, is to modify the surface of the lapping wheel.

Figure 4:
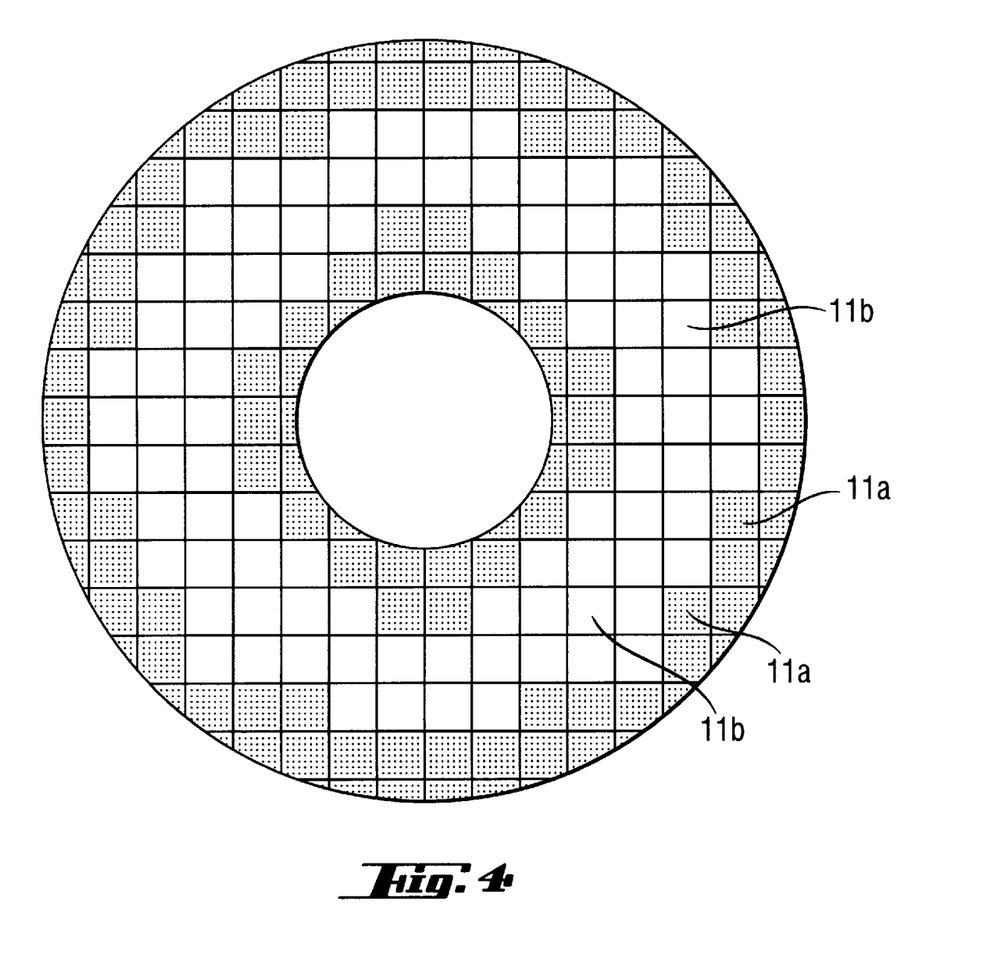
FIGS. 4 to 7 show a plan view of the modified surfaces of lapping wheels.

FIG. 4 illustrates one embodiment of a lapping wheel with a modified surface. The surface of the lapping wheel is divided as far as possible into square surface elements 11a and 11b. Not all the surface elements have the same wear resistance. The shaded surface; elements 11a have a lower hardness than the remaining surface elements 11b. The position of the harder surface elements on the modified lapping wheel is selected in such a way that they are situated at: locations at which, according to a wear profile which has been determined, a high level of load on the lapping wheel surface is to be expected. Correspondingly, the less hard surface elements are positioned where a lower load on the lapping wheel surface is expected. The hardnesses of the surface elements are selected in such a way that overall the wear performance of the lapping wheel is made more uniform. The most suitable material for the surface elements is preferably selected on the basis of results of tests.

Figure 5:
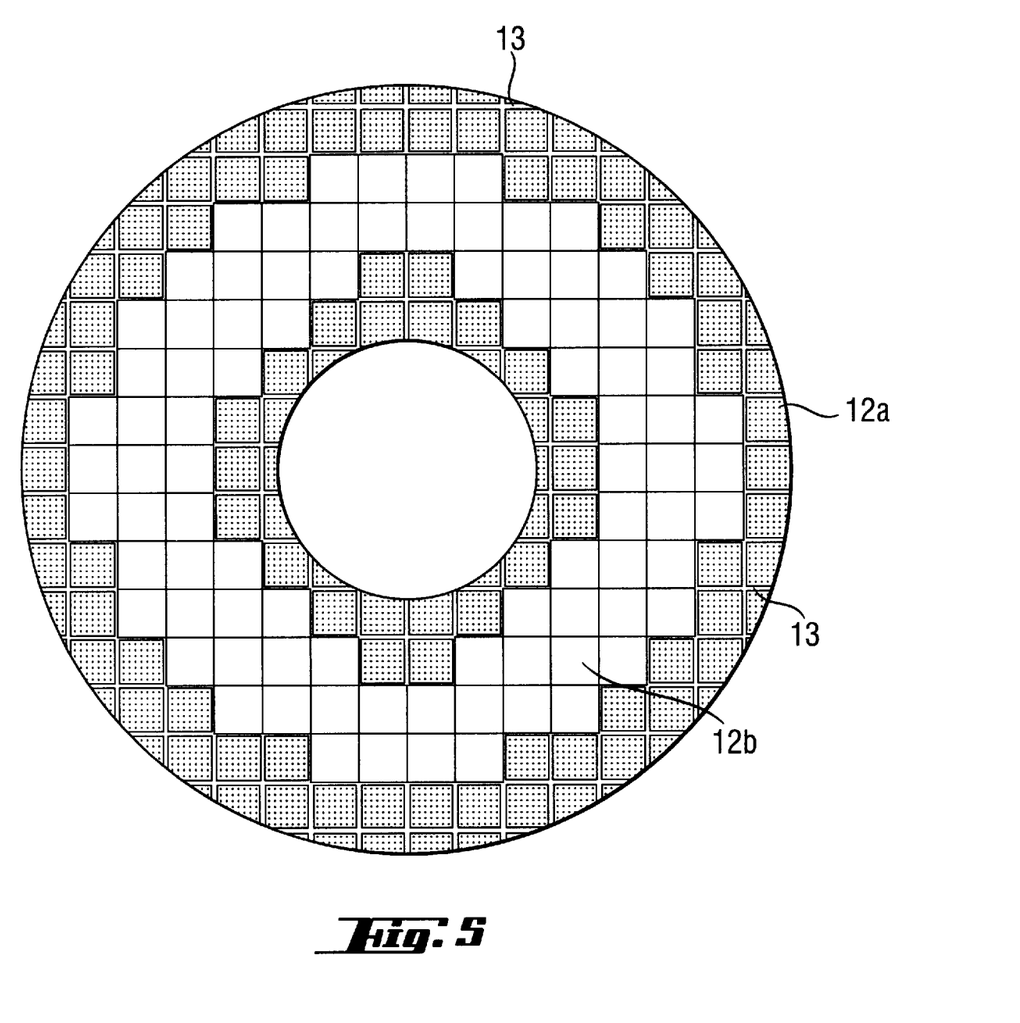

The modified lapping wheel surface illustrated in FIG. 5 is also divided into square surface elements 12a and 12b which have different wear resistances. In contrast to the embodiment in accordance with FIG. 4, the shaded surface elements 12a, which have a lower wear resistance, are arranged in such a way that a gap 13 of a specific width remains between them. These surface elements are again situated at locations on the lapping wheel surface at which a lower load is expected. The space required for the gaps is created by reducing the basic surface area of the surface elements. As a result, the wear resistance of the surface elements is reduced further, since the basic surface area which is available for load per surface element has become smaller and the load to be expected nevertheless remains unchanged.

Figure 6:
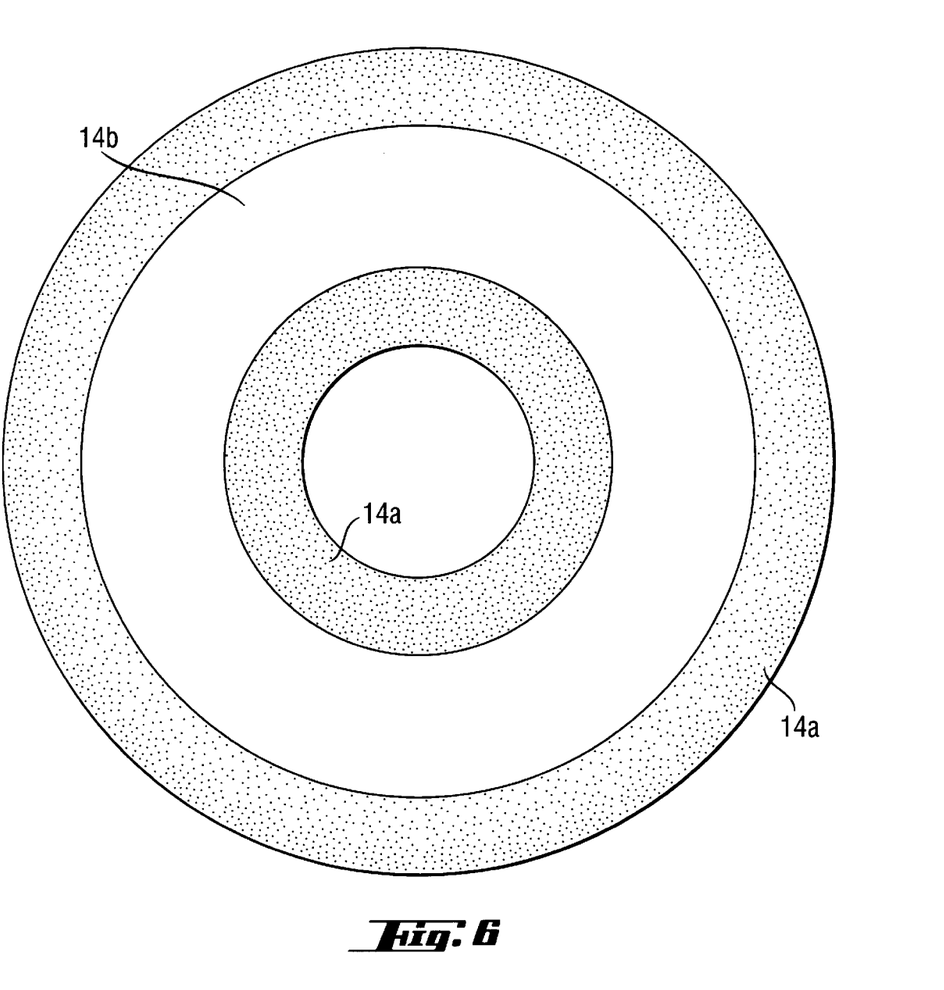

FIG. 6 shows another embodiment of a modified lapping wheel surface. In this embodiment, the surface is divided into surface elements 14a and 14b which are in the shape of concentric rings. The shaded surface elements 14a again have a lower wear resistance than the other surface elements 14b. The positions of the surface elements are again selected in such a way that surface elements which have the lower wear resistance are found in regions which, according to a wear profile which has been determined, are exposed to a lower level of load during the machining of workpieces. Other surface elements are positioned in such a way that surface elements which have the higher wear resistance are in positions at which a high level of load is to be expected.

Figure 7:
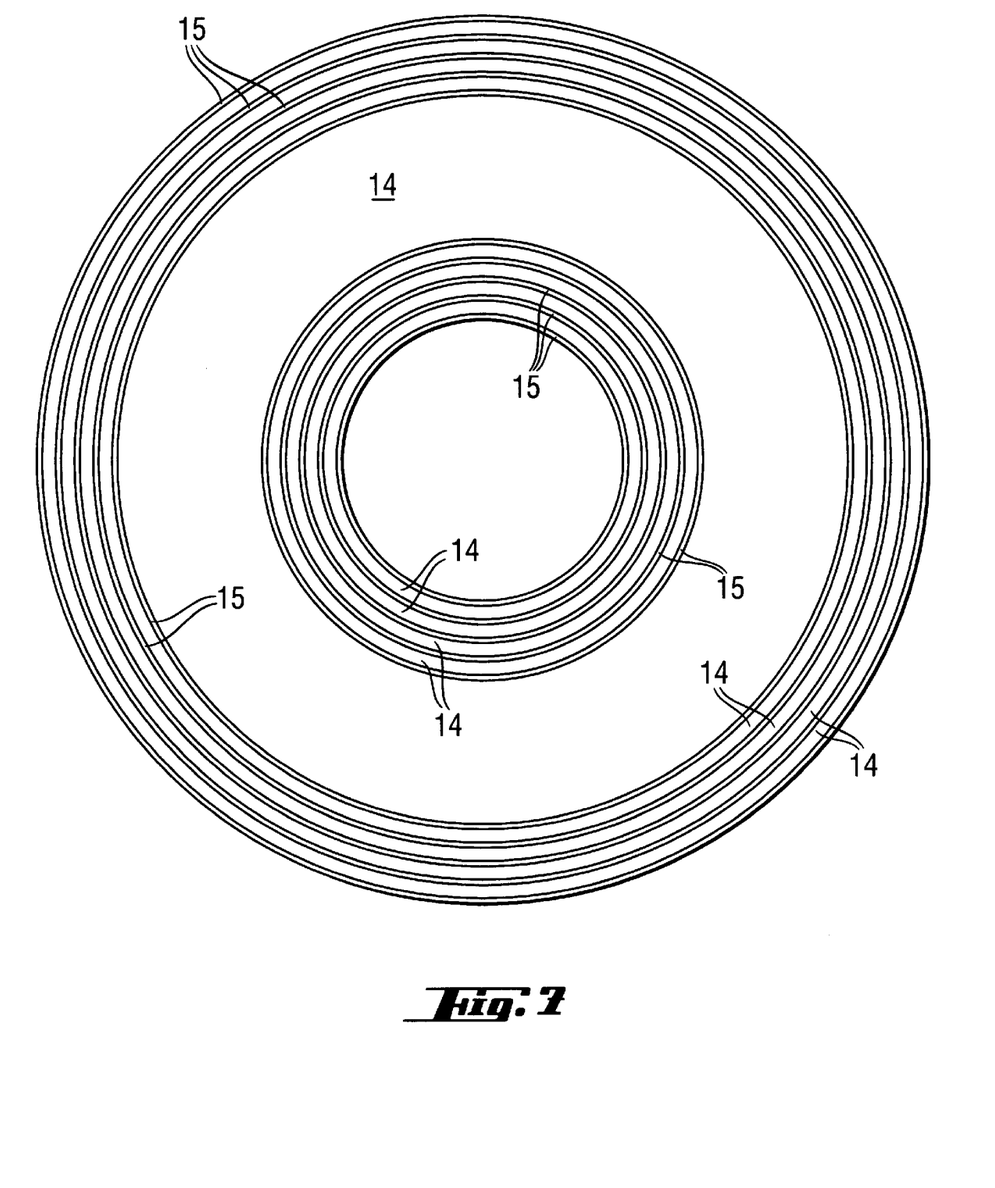

FIG. 7 shows a further embodiment of a modified lapping wheel surface. The surface of this lapping wheel is divided into surface elements 14 which are in the shape of rings. The surface elements consist of the same material and there is no difference in hardness between them. Nevertheless, gaps 15 between the surface elements mean that the wear resistance of the lapping wheel surface in the region of the inner and outer edges of the lapping wheel is reduced.

In the case of double side machining of wafer shaped workpieces, in particular in the case of lapping and polishing of semiconductor wafers, the carriers used also have a particular effect on the wear performance of the lapping wheels or polishing cloths.

Figure 8:
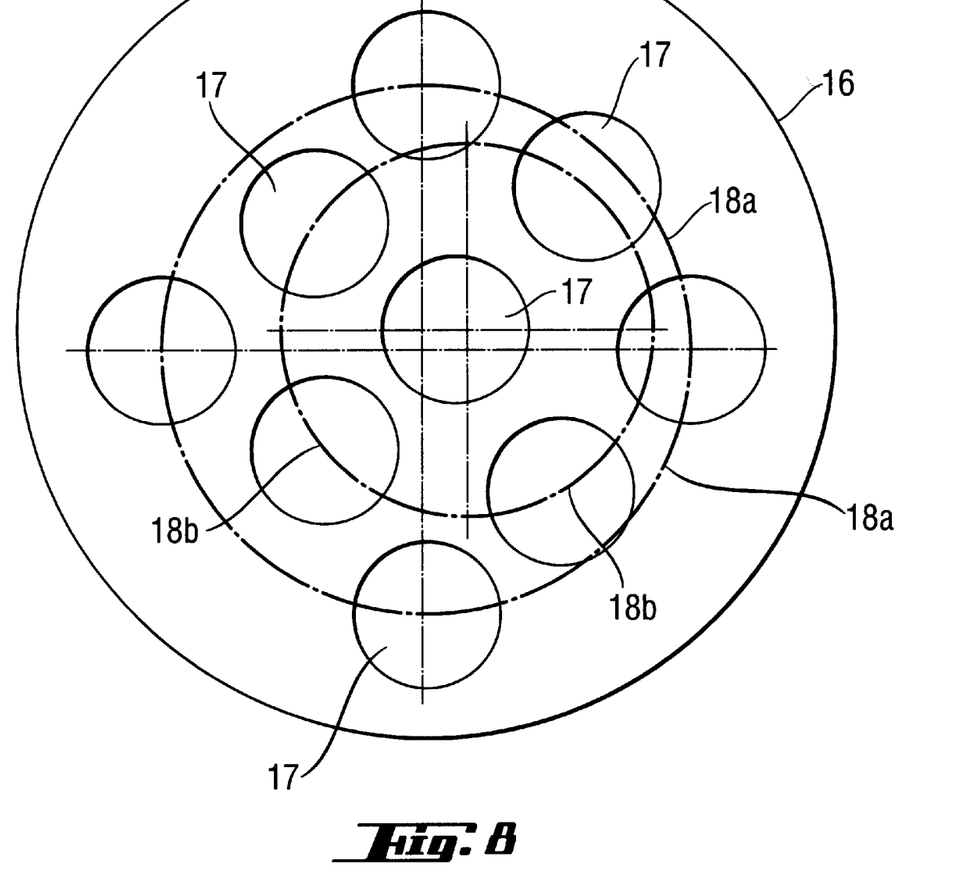
FIG. 8 shows a carrier with openings which are arranged advantageously so as to receive semiconductor wafers.

FIG. 8 shows a particularly preferred embodiment of a carrier 16. The carrier is distinguished by the fact that the workpiece receptacles 17 are arranged in such a way that, taking into account the kinematics of the machining operation, the surfaces of the lapping wheels or polishing cloths are subjected to as uniform a level of loading as possible. The workpiece receptacles are circular openings in the carrier. The centers of the openings lie on circular paths 18a and 18b. If appropriate, an additional opening is provided, the center of which lies in the region of the center of the carrier. The centers of adjacent openings which lie on circular paths lie on different circular paths. It is particularly preferable for the circular paths 18a and 18b to lie eccentrically with respect to one another.

Accordingly, while a few embodiments of the present invention have been shown and described, it is to be understood that many changes and modifications may be made thereunto without departing from the spirit and scope of the invention as defined in the appended claims.

What is claimed is:

1. A method for achieving a wear performance which is as linear as possible for a tool which has a planar working surface for material removing machining of wafer shaped workpieces, comprising (a) determining a wear profile of the working surface; and
   (b) replacing the working surface by a modified working surface which is divided into surface elements, each surface element having a specific wear resistance and having a specific position on the modified working surface, and each surface element being located on the modified working surface in such a way that there is a relationship between the wear profile determined, and the wear resistance and the position of the surface element.

2. The method as claimed in claim 1, comprising decreasing the wear resistance of the surface elements by reducing surface area.

3. A tool having a planar working surface for material removing machining of wafer shaped workpieces, comprising a working surface divided into surface elements, each surface element having a specific wear resistance and adopting a specific position on the working surface, and there being a connection between a wear profile determined, and the wear resistance and the position of each surface element;

the determined wear profile being represented by wear deaths between an inner edge and an outer edge of the working surface, the wear deaths steadily increasing between the inner edge and a first local maximum and passing through a local minimum and a second local maximum and steadily decreasing between the second local maximum and the outer edge.

4. The tool as claimed in claim 3, wherein the surface elements, in plan view, have a geometric shape which is selected from a group consisting of rings, ring segments, polygons with at least three sides, circles and circle segments.

5. A carrier for holding wafer-like workpieces between planar working surfaces of a tool for machining wafer shaped workpieces, comprising adjacent circular openings for accommodating the workpieces, said openings having centers arranged on circular paths;

and wherein the circular paths are eccentric with respect to one another and the centers of adjacent openings lie on different circular paths.

* * * * *